US009734994B2

(12) United States Patent
Shin et al.

(10) Patent No.: US 9,734,994 B2
(45) Date of Patent: Aug. 15, 2017

(54) CRYSTALLINE ALLOY HAVING GLASS-FORMING ABILITY, PREPARATION METHOD THEREOF, ALLOY TARGET FOR SPUTTERING, AND PREPARATION METHOD THEREOF

(71) Applicant: KOREA INSTITUTE OF INDUSTRIAL TECHNOLOGY, Chungcheongnam-do (KR)

(72) Inventors: Seung-Yong Shin, Seoul (KR); Kyoung-Il Moon, Incheon (KR); Ju-Hyun Sun, Incheon (KR); Chang-Hun Lee, Incheon (KR)

(73) Assignee: KOREA INSTITUTE OF INDUSTRIAL TECHNOLOGY, Cheonan-si, Chungcheongnam-do (KR)

( * ) Notice: Subject to any disclaimer, the term of this patent is extended or adjusted under 35 U.S.C. 154(b) by 410 days.

(21) Appl. No.: 14/362,491

(22) PCT Filed: Dec. 4, 2012

(86) PCT No.: PCT/KR2012/010397
§ 371 (c)(1),
(2) Date: Jun. 3, 2014

(87) PCT Pub. No.: WO2013/085237
PCT Pub. Date: Jun. 13, 2013

(65) Prior Publication Data
US 2014/0346038 A1 Nov. 27, 2014

(30) Foreign Application Priority Data
Dec. 6, 2011 (KR) .................. 10-2011-0129888

(51) Int. Cl.
| | |
|---|---|
| H01J 37/32 | (2006.01) |
| C22C 16/00 | (2006.01) |
| C23C 14/34 | (2006.01) |
| B22F 3/12 | (2006.01) |
| C22C 30/02 | (2006.01) |
| C22C 1/00 | (2006.01) |
| C22C 45/00 | (2006.01) |
| B22F 9/08 | (2006.01) |
| B22F 9/10 | (2006.01) |
| C22C 1/04 | (2006.01) |

(52) U.S. Cl.
CPC ............ *H01J 37/3255* (2013.01); *B22F 3/12* (2013.01); *B22F 9/082* (2013.01); *B22F 9/10* (2013.01); *C22C 1/002* (2013.01); *C22C 1/0458* (2013.01); *C22C 16/00* (2013.01); *C22C 30/02* (2013.01); *C22C 45/00* (2013.01); *C23C 14/3414* (2013.01); *C22C 2200/02* (2013.01)

(58) Field of Classification Search
CPC .......... C22C 16/00; B22F 3/12; H01J 37/3255
See application file for complete search history.

(56) References Cited

U.S. PATENT DOCUMENTS

| | | | |
|---|---|---|---|
| 6,231,697 B1 * | 5/2001 | Inoue ..................... | C22C 45/10 |
| | | | 148/561 |
| 2010/0320085 A1 * | 12/2010 | Nakamura ......... | B01D 67/0072 |
| | | | 204/298.13 |

FOREIGN PATENT DOCUMENTS

| | | |
|---|---|---|
| KR | 1019990023946 A | 3/1999 |
| KR | 1020130063518 A | 6/2013 |

OTHER PUBLICATIONS

Nagase et al. "Electron irradiation induced crystallization behavior in Zr66.7Cu33.3 and Zr65.0Al7.5Cu27.5 amorphous alloys," Materials Science and Engineering A352 (2003) 251-260.*

* cited by examiner

Primary Examiner — Jessee Roe
Assistant Examiner — Christopher Kessler
(74) Attorney, Agent, or Firm — Ladas & Parry LLP; Loren K. Thompson

(57) ABSTRACT

Provided are a crystalline alloy having significantly better thermal stability than an amorphous alloy as well as glass-forming ability, and a method of manufacturing the crystalline alloy. The present invention also provides an alloy sputtering target that is manufactured by using the crystalline alloy, and a method of manufacturing the alloy target. According to an aspect of the present invention, provided is a crystalline alloy having glass-forming ability which is formed of three or more elements having glass-forming ability, wherein the average grain size of the alloy is in a range of 0.1 μm to 5 μm and the alloy includes 5 at % to 20 at % of aluminum (Al), 15 at % to 40 at % of any one or more selected from copper (Cu) and nickel (Ni), and the remainder being zirconium (Zr).

17 Claims, 11 Drawing Sheets

(a)  (b)

(a)  (b)

(a)                      (b)

(a)　　　　　　　　　　　　(b)

CRYSTALLINE ALLOY HAVING GLASS-FORMING ABILITY, PREPARATION METHOD THEREOF, ALLOY TARGET FOR SPUTTERING, AND PREPARATION METHOD THEREOF

TECHNICAL FIELD

The present invention relates to a crystalline alloy having excellent thermal and mechanical stability which consists of three or more metals having glass-forming ability, and an alloy target for sputtering which is formed of the crystalline alloy.

BACKGROUND ART

A sputtering process denotes a technique in which high-speed argon ions collide with a target to eject target atoms and the ejected target atoms are then supplied to a substrate to form a thin film on a surface of the substrate. The sputtering process is not only being used in a semiconductor fabrication process and fabrication of micro devices such as microelectromechanical systems (MEMS), but is also being used in coating for improving abrasion resistance of various tools, dies, and automotive parts.

In a case where a nanocomposite thin film including an amorphous thin film or amorphous phase is fabricated by sputtering, a target formed of an amorphous material may be used. The amorphous target may be formed of a multi-component alloy having high glass-forming ability, and heterogeneous metal elements ejected from the amorphous target may form an alloy thin film having an amorphous phase on the surface of the substrate.

However, a temperature of the amorphous target may be increased due to the collision of ions during a sputtering process, and a structure near the surface of the target may be changed due to the increase in temperature. That is, localized crystallization may proceed on the surface of the target due to characteristics of the thermally unstable amorphous phase when the temperature of the target increases. Such localized crystallization may cause structural relaxation and volume changes in the target. As a result, brittleness of the target may increase and thus, the target may be easily fractured during the sputtering process. In a case where the target is fractured during the process, serious limitations in production may occur. Therefore, it is very important to secure a stable target in which such fracture does not occur during the sputtering process.

DISCLOSURE OF THE INVENTION

Technical Problem

The present invention provides a crystalline alloy having significantly better thermal stability than an amorphous alloy as well as glass-forming ability, and a method of manufacturing the crystalline alloy. The present invention also provides an alloy sputtering target that is manufactured by using the crystalline alloy, and a method of manufacturing the alloy target. However, the above is illustrative only and is not intended to limit the scope of the present invention.

Technical Solution

According to an aspect of the present invention, there is provided a crystalline alloy having glass-forming ability, wherein the alloy includes three or more elements, wherein the average grain size of the alloy is in a range of 0.1 µm to 5 µm and wherein the alloy includes 5 at % to 20 at % of aluminum (Al), 15 at % to 40 at % of any one or more elements selected from copper (Cu) and nickel (Ni), and the remainder being zirconium (Zr).

According to another aspect of the present invention, there is provided a crystalline alloy having glass-forming ability, wherein the alloy includes three or more elements, wherein the average grain size of the alloy is in a range of 0.1 µm to 5 µm and wherein the alloy includes not less than 5 at % but less than 20 at % of Al, 15 at % to 40 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being Zr.

The alloy having glass-forming ability may be an alloy in which an amorphous ribbon having a casting thickness of 20 µm to 100 µm may be obtained when a melt of the alloy is cast at a cooling rate of $10^4$ K/sec to $10^6$ K/sec.

Also, the average grain size of the crystalline alloy may be in a range of 0.1 µm to 0.5 µm.

According to another aspect of the present invention, there is provided an alloy sputtering target that includes the above-described crystalline alloy.

According to another aspect of the present invention, there is provided a method of manufacturing a crystalline alloy having glass-forming ability, the method including: controlling the average grain size to be in a range of 0.1 µm to 5 µm by heating an amorphous alloy or a nanocrystalline alloy having glass-forming ability, which comprises three or more metallic elements, in a temperature range of a crystallization initiation temperature of the amorphous alloy or the nanocrystalline alloy or higher but lower than a melting temperature thereof, wherein the amorphous alloy or the nanocrystalline alloy includes 5 at % to 20 at % of aluminum (Al), 15 at % to 35 at % of any one or more elements selected from copper (Cu) and nickel (Ni), and the remainder being zirconium (Zr).

According to another aspect of the present invention, there is provided a method of manufacturing a crystalline alloy having glass-forming ability, the method including: controlling the average grain size to be in a range of 0.1 µm to 5 µm by heating an amorphous alloy or a nanocrystalline alloy having glass-forming ability, which comprises three or more metallic elements, in a temperature range of a crystallization initiation temperature of the amorphous alloy or the nanocrystalline alloy or higher but lower than a melting temperature thereof, wherein the amorphous alloy or the nanocrystalline alloy includes 5 at % to 15 at % of Al, 15 at % to 30 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being Zr.

Here, the average grain size may be controlled to be in a range of 0.1 µm to 0.5 µm.

According to another aspect of the present invention, there is provided a method of manufacturing an alloy sputtering target, the method including: preparing a plurality of amorphous alloys or nanocrystalline alloys having glass-forming ability and comprising three or more metallic elements; and heat-pressurizing the plurality of amorphous alloys or nanocrystalline alloys in a temperature range of a crystallization initiation temperature of the amorphous alloy or the nanocrystalline alloy or higher but lower than a melting temperature thereof to manufacture a crystalline alloy having an average grain size of 0.1 μm to 5 μm, wherein the amorphous alloy or the nanocrystalline alloy includes 5 at % to 20 at % of aluminum (Al), 15 at % to 35 at % of any one or more elements selected from copper (Cu) and nickel (Ni), and the remainder being zirconium (Zr).

According to another aspect of the present invention, there is provided a method of manufacturing an alloy sputtering target, the method including: preparing a plurality of amorphous alloys or nanocrystalline alloys having glass-forming ability and comprising three or more metallic elements; and heat-pressurizing the plurality of amorphous alloys or nanocrystalline alloys in a temperature range of a crystallization initiation temperature of the amorphous alloy or the nanocrystalline alloy or higher but lower than a melting temperature thereof to manufacture a crystalline alloy having an average grain size of 0.1 μm to 5 μm, wherein the amorphous alloy or the nanocrystalline alloy includes 5 at % to 15 at % of Al, 15 at % to 30 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being Zr.

In this case, the average grain size may be in a range of 0.1 μm to 0.5 μm.

The amorphous alloy or the nanocrystalline alloy, for example, may be amorphous alloy powder or nanocrystalline alloy powder, and the amorphous alloy powder or the nanocrystalline alloy powder may be prepared by an atomizing method, wherein the atomizing method includes: preparing a melt in which the three or more metallic elements are melted; and spraying gas on the melt.

As another example, the amorphous alloy or the nanocrystalline alloy may be an amorphous alloy ribbon or a nanocrystalline alloy ribbon, and the amorphous alloy ribbon or the nanocrystalline alloy ribbon may be prepared by a melt spinning method, wherein the melt spinning method includes: preparing a melt in which the three or more metallic elements are melted; and introducing the melt to a rotating roll.

As another example, the amorphous alloy or the nanocrystalline alloy may be an amorphous alloy cast or a nanocrystalline alloy cast, and the amorphous alloy cast or the nanocrystalline alloy cast may be prepared by a copper mold casting method, wherein the copper mold casting method includes: preparing a melt in which the three or more metallic elements are melted; and injecting the melt into a copper mold using a pressure difference between the inside and the outside of the copper mold.

The amorphous alloy cast or the nanocrystalline alloy cast may have a rod shape or plate shape.

According to another aspect of the present invention, there is provided a method of manufacturing an alloy sputtering target, the method including: heating an amorphous alloy or a nanocrystalline alloy in a temperature range of a crystallization initiation temperature of the amorphous alloy or the nanocrystalline alloy or higher but lower than a melting temperature thereof to manufacture a crystalline alloy having an average grain size of 0.1 μm to 5 μm, wherein the amorphous alloy or the nanocrystalline alloy is prepared by casting a melt comprising three or more metallic elements and having glass-forming ability, and includes 5 at % to 20 at % of aluminum (Al), 15 at % to 35 at % of any one or more elements selected from copper (Cu) and nickel (Ni), and the remainder being zirconium (Zr).

According to another aspect of the present invention, there is provided a method of manufacturing an alloy sputtering target, the method including: heating an amorphous alloy or a nanocrystalline alloy in a temperature range of a crystallization initiation temperature of the amorphous alloy or the nanocrystalline alloy or higher but lower than a melting temperature thereof to manufacture a crystalline alloy having an average grain size of 0.1 μm to 5 μm, wherein the amorphous alloy or the nanocrystalline alloy is prepared by casting a melt comprising three or more metallic elements and having glass-forming ability, and includes 5 at % to 15 at % of Al, 15 at % to 30 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being zirconium (Zr).

Advantageous Effects

According to embodiments of the present invention, since thermal/mechanical stability of a target may be significantly improved, a phenomenon may not occur in which the target is abruptly broken during a sputtering process. Thus, the sputtering process may be stably performed. Also, since a very uniform microstructure may be obtained, there may be an effect of minimizing a compositional deviation between a target composition and a thin film composition due to the difference between sputtering yields of various components constituting the target and an effect of securing uniformity of the composition according to the thickness of the thin film. However, the scope of the present invention is not limited to such effects.

BEST MODE FOR CARRYING OUT THE INVENTION

Figure 1:
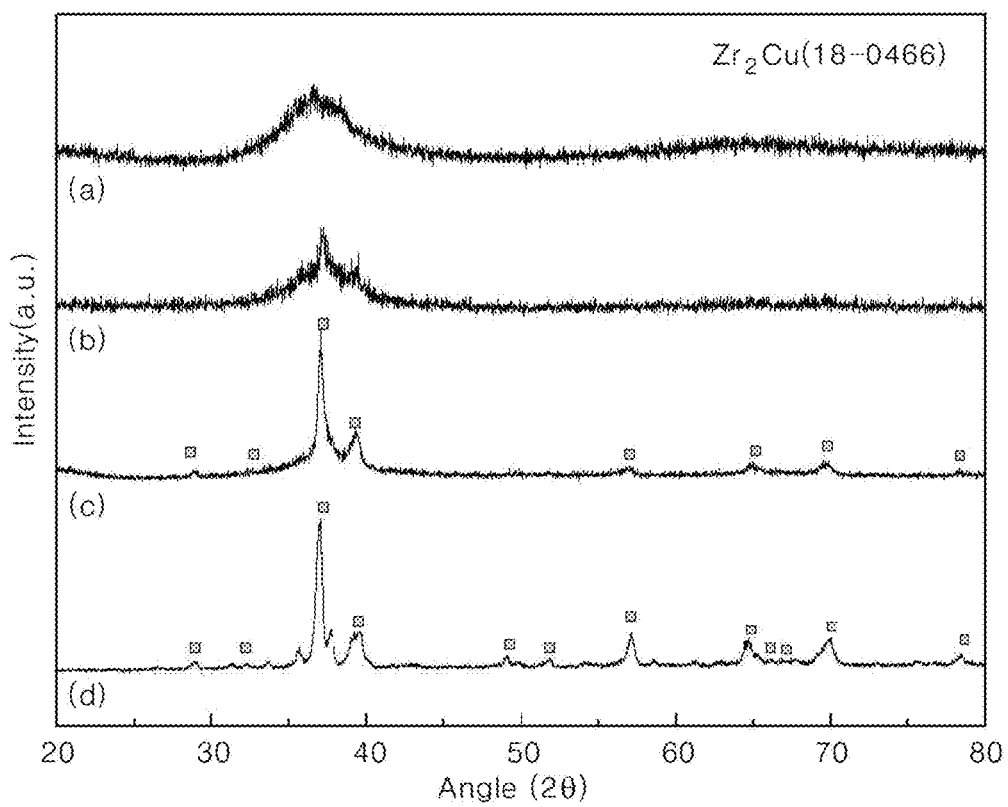
FIG. 1 is the result of investigating glass-forming ability of a $Zr_{63.9}Al_{10}Cu_{26.1}$ copper mold suction cast (rod) according to an embodiment of the present invention using X-ray diffraction.

Hereinafter, the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Also, sizes of elements in the drawings may be exaggerated for convenience of explanation.

A crystalline alloy according to the present invention may be realized by heating an amorphous alloy or a nanocrystalline alloy, which includes three or more metallic elements and has glass-forming ability, in a temperature range of a crystalline initiation temperature of the amorphous alloy or the nanocrystalline alloy or higher but lower than a melting temperature thereof. The amorphous alloy is subjected to a grain growth process after crystallization occurs during the heating process. With respect to the nanocrystalline alloy, the growth of nanograins may occur. Here, heating conditions may be controlled to obtain an average grain size of the alloy target in a range of 0.1 μm to 5 μm, for example, 0.1 μm to 1 μm, or 0.1 μm to 0.5 μm, or 0.3 μm to 0.5 μm.

In the present invention, the expression "crystallization initiation temperature" denotes a temperature at which an alloy in an amorphous state begins to crystallize, wherein the temperature has an inherent value according to a specific alloy composition. Therefore, the crystallization initiation temperature of a nanocrystalline alloy may be defined as a temperature at which an amorphous alloy having the same composition as the nanocrystalline alloy begins to crystallize.

The amorphous alloy may denote a metal alloy which does not substantially have a specific crystal structure, does not exhibit a resolvable crystalline peak at a specific Bragg angle in an X-ray diffraction pattern, and has a phase exhibiting a broad diffusion peak in a wide angle range. Also, the nanocrystalline alloy may denote a metal alloy having an average grain size of less than 100 nm.

The glass-forming ability denotes a relative measure, representing whether an alloy having a specific composition may easily become amorphous up to a certain degree of a cooling rate. In general, in order to form an amorphous alloy by casting, a high cooling rate of a predetermined level or more is necessary, and in a case where a casting method with a relative slow cooling rate (e.g., copper mold casting method) is used, a glass-forming composition range may be reduced. In contrast, since a rapid solidification method, such as melt spinning in which a molten alloy is dropped on a rotating copper roll to solidify the molten alloy as a ribbon or wire, may obtain a maximized cooling rate of $10^4$ K/sec to $10^6$ K/sec or more, the glass-forming composition range may be increased. Therefore, an evaluation of whether a specific composition has a certain degree of glass-forming ability may generally result in a relative value according to a cooling rate of a rapid cooling process used.

The glass-forming ability may depend on an alloy composition and a cooling rate. In general, since the cooling rate may be inversely proportional to a casting thickness [cooling rate∝(casting thickness)$^{-2}$], the glass-forming ability may be relatively quantified by evaluating a critical thickness of a cast in which an amorphous phase may be obtained during casting. For example, when using the copper mold casting method, the glass-forming ability may be expressed by a critical casting thickness (diameter with respect to a rod) of a cast in which an amorphous phase may be obtained. As another example, when forming a ribbon by melt spinning, the glass-forming ability may be expressed by a critical thickness of the ribbon in which an amorphous phase is formed.

In the present invention, an alloy having glass-forming ability denotes an alloy in which an amorphous ribbon having a casting thickness of 20 μm to 100 μm may be obtained when a melt of the alloy is cast at a cooling rate of $10^4$ K/sec to $10^6$ K/sec.

An alloy having glass-forming ability according to the present invention is composed of three or more elements, a difference between atomic radii of main elements is large at 12% or more, and heat of mixing between the main elements is a negative value.

Three or more metallic elements having glass-forming ability according to an embodiment of the present invention may be one or more elements selected from the group consisting of zirconium (Zr), aluminum (Al), copper (Cu), and nickel (Ni). For example, the alloy having glass-forming ability may be a ternary alloy formed of Zr, Al, and Cu, a ternary alloy formed of Zr, Al, and Ni, or a quaternary alloy formed of Zr, Al, Cu, and Ni.

Here, the alloy may include 5 at % to 20 at % of Al, 15 at % to 40 at % of one or more elements selected from Cu and Ni, and the remainder being Zr. Specifically, the Al may be included in an amount of 6 at % to 13 at %, and the one or more elements selected from Cu and Ni may be included in an amount of 18 at % to 30 at %.

As another example, the three or more metallic elements having glass-forming ability may be a quaternary or more alloy formed of any one or more elements selected from the group consisting of Zr, Al, Cu, and Ni, and M (where M is any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe)). For example, the alloy may be a multi-component alloy formed of Zr, Al, Cu, and M, a multi-component alloy formed of Zr, Al, Ni, and M, or a multi-component alloy formed of Zr, Al, Cu, Ni, and M.

Here, the alloy may include not less than 5 at % but less than 20 at % of Al, 15 at % to 40 at % of any one or more elements of Cu and Ni, 8 at % or less (greater than 0) of M, and the remainder being Zr. Specifically, the Al may be included in an amount of 6 at % to 13 at %, the any one or more elements of Cu and Ni may be included in an amount of 17 at % to 30 at %, and M is included in an amount of 5 at % or less (greater than 0).

The crystalline alloy according to the present invention may have relatively better thermal stability than an amorphous alloy having the same composition. That is, with respect to the amorphous alloy, nanocrystals may be locally formed while partial crystallization may locally occur due to thermal instability caused by thermal energy transferred from the outside. Such localized crystallization may decrease strength due to a structural relaxation phenomenon of the amorphous alloy and fracture toughness may be reduced.

However, an alloy, in which the grain size thereof is controlled by crystallization and/or grain growth of an amorphous alloy or nanocrystalline alloy, such as the crystalline alloy according to the present invention, does not exhibit large changes in microstructure even if heat is applied from the outside. Therefore, fracture due to thermal and mechanical instabilities of a typical amorphous alloy or nanocrystalline alloy does not occur.

The crystalline alloy according to embodiments of the present invention may be successfully used in areas requiring thermal stability and for example, may be used in a target for sputtering.

An amorphous alloy target formed of a plurality of metallic elements having glass-forming ability may be used to form an amorphous thin film or a nanocomposite thin film by sputtering or reactive sputtering. Ions accelerated from plasma during a sputtering process may continuously collide with a sputtering target, and accordingly, a temperature of the sputtering target may inevitably increase during the sputtering process. In a case where the sputtering target is composed of an amorphous phase, localized crystallization at the surface of the target according to the temperature rise may proceed during the sputtering process, and the localized crystallization may increase brittleness of the target to facilitate the fracture of the target during the sputtering process.

In contrast, since the crystalline alloy according to the present invention may have a microstructure in which grains having a specific size range controlled by a heat treatment are uniformly distributed, thermal/mechanical stability may be significantly improved. Thus, changes in the localized structure may not occur even due to the temperature rise of the target occurred during the sputtering and accordingly, the mechanical instability as described above may not occur. Therefore, the crystallization alloy target of the present invention may be used in stably forming an amorphous thin film or a nanocomposite thin film by using sputtering.

Hereinafter, a method of manufacturing an alloy sputtering target by using the crystalline alloy of the present invention will be exemplarily described.

The sputtering target using the crystalline alloy of the present invention may be manufactured by casting the above-described amorphous alloy or nanocrystalline alloy in a similar size and shape to those of a sputtering target actually used. Crystallization or grain growth of the cast amorphous alloy or nanocrystalline alloy may be performed by a heat treatment, i.e., annealing to manufacture a crystalline alloy target.

Another method is that a plurality of the above-described amorphous alloys or nanocrystalline alloys is prepared and the plurality of amorphous alloys or nanocrystalline alloys is heat-pressurized to be bonded to each other. Thus, a sputtering target may be manufactured. Plastic deformation of the amorphous alloy or the nanocrystalline alloy may occur during the heat-pressurizing.

Here, the annealing treatment or heat pressurization may be performed in a temperature range of a crystallization initiation temperature of the amorphous alloy or nanocrystalline alloy or more to less than a melting temperature thereof. The crystallization initiation temperature is defined as a temperature at which phase transition of an alloy having a specific composition from an amorphous state to a crystalline state begins.

The amorphous alloy or the nanocrystalline alloy prepared in plurality, for example, may be amorphous alloy powder or nanocrystalline alloy powder. Aggregates of these alloy powders may be bonded together by pressurized sintering the aggregates in a sintering mold to be manufactured in a shape and a size similar to those of an actual target. Here, the pressurized sintering may be performed in a temperature range of a crystallization initiation temperature of a composition of the alloy powder or more to less than a melting temperature thereof. Crystallization and/or grain growth may occur while the aggregates of the amorphous alloy powder or the aggregates of the nanocrystalline alloy powder are bonded together by interdiffusion during the heating process. Here, time and/or temperature of the crystallization or grain growth are controlled to obtain grains having a specific size range. Therefore, a grain size of the alloy having crystallization or grain growth finally completed may be 5 μm or less, and for example, may be in a range of 0.1 μm to 5 μm, or 0.1 μm to 1 μm, or 0.1 μm to 0.5 μm, or 0.3 μm to 0.5 μm.

Here, the amorphous alloy powder or the nanocrystalline alloy powder may be prepared by atomizing. Specifically, a melt is prepared in which three or more metallic elements having glass-forming ability are melted, and alloy powder may be formed by rapid cooling the melt by spraying inert gas, such as argon gas, on the melt while atomizing the melt.

As another example, the amorphous alloy or nanocrystalline alloy prepared in plurality may be an amorphous alloy ribbon or a nanocrystalline alloy ribbon. The plurality of ribbons is stacked and a target may then be formed by heat-pressurizing the ribbons in a temperature range of a crystallization initiation temperature of a composition of the alloy ribbon or more to less than a melting temperature thereof. Here, crystallization and/or grain growth may occur while the amorphous alloy ribbon stack or the nanocrystalline alloy ribbon stack is bonded together by interdiffusion between the ribbons during the heat-pressurizing process. An interface between the stacked alloy ribbons generated during the above process may be annihilated by interdiffusion.

Here, the amorphous alloy ribbon or the nanocrystalline alloy ribbon may be prepared by a rapid solidification process such as melt spinning. Specifically, a melt is prepared in which three or more metallic elements having glass-forming ability are melted, and an amorphous alloy or nanocrystalline alloy in a ribbon shape may be prepared by introducing the melt to the surface of a roll rotating at a high speed and rapidly solidifying the melt.

As another example, the amorphous alloy or nanocrystalline alloy prepared in plurality may be an amorphous alloy cast or a nanocrystalline alloy cast. Here, the amorphous alloy cast or the nanocrystalline alloy cast may have a rod or plate shape. Crystallization and/or grain growth may occur while a stack having the plurality of amorphous alloy casts or a stack having the plurality of nanocrystalline alloy casts is bonded by interdiffusion between individual alloy casts during the heat-pressurizing process. Here, an interface between the alloy casts may be annihilated by interdiffusion.

The amorphous alloy cast or the nanocrystalline alloy cast may be prepared by using a suction method or pressurizing method, in which the melt is introduced into the inside of a mold formed of copper having high cooling ability using a pressure difference between the inside and outside of the mold. For example, when using a copper mold casting method, a melt is prepared in which three or more metallic elements having glass-forming ability are melted, and an amorphous alloy cast or nanocrystalline alloy cast having a predetermined shape may be prepared by injecting the melt into a copper mold at a high speed through a nozzle by pressurizing or suctioning the melt and rapid solidifying the melt.

Similar to the alloy powder, with respect the alloy ribbon or the alloy cast, a grain size of the finally crystallized alloy may be controlled to be in the above-described range.

Hereinafter, examples are provided to help understand the present invention. However, the following examples are merely provided to more clearly understand the present invention, not to limit the scope of the present invention.

Crystallization of Rod-Shaped Amorphous Alloy Cast (Alloy Rod)

Figure 2:
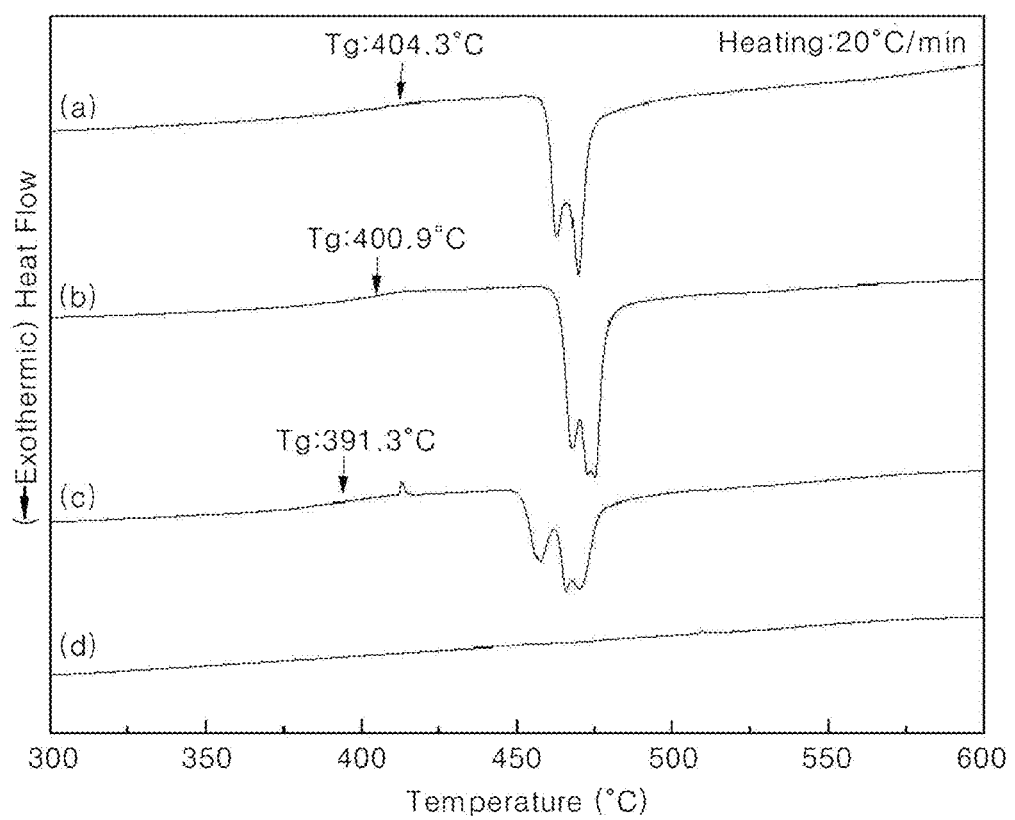
FIG. 2 illustrates the result of differential scanning calorimetry (DSC) analysis exhibiting crystallization characteristics of the $Zr_{63.9}Al_{10}Cu_{26.1}$ copper mold suction cast (rod) according to the embodiment of the present invention.

FIG. 1 illustrates the result of investigating glass-forming ability of a Zr—Al—Cu alloy rod according to an embodiment of the present invention using X-ray diffraction, and FIG. 2 illustrates the result of differential scanning calorimetry (DSC) analysis exhibiting crystallization characteristics according to a diameter of the Zr—Al—Cu alloy rod. A composition of the Zr—Al—Cu included 63.9 at % of Zr, 10 at % of Al, and 26.1 at % of Cu. The composition is expressed by $Zr_{63.9}Al_{10}Cu_{26.1}$ (hereinafter, the composition of the alloy is expressed by this way).

Alloy buttons having the above composition were melted by arc melting and the $Zr_{63.9}Al_{10}Cu_{26.1}$ alloy rod was then prepared by a copper mold suction casting method. A melting temperature (solidus temperature) of the $Zr_{63.9}Al_{10}Cu_{26.1}$ alloy rod was 913° C. (a), (b), (c), and (d) of FIGS. 1 and 2 respectively represent alloy rods having a diameter of 2 mm, 5 mm, 6 mm, and 8 mm.

Referring to FIG. 1, in the alloy rod having a diameter of 5 mm or less, a broad diffusion peak typically observed in an amorphous phase was observed. However, it may be understood that crystalline peaks were observed in the alloy rod having a diameter of 6 mm or more. As the result of investigating the alloy rods having a diameter of 6 mm and 8 mm with an SEM analysis, the alloy rods had a very fine nanocrystalline structure in which an average grain size of main grains was 100 nm or less.

In general, a cooling rate of a mold casting method such as the copper mold suction casting method is lower than that of a melt spinning method. Thus, it may be understood that the alloy had glass-forming ability defined in the present invention. Also, in a case where the copper mold suction casting method is used, it may be understood that an amorphous alloy having a thickness or diameter of 5 mm or less may be prepared by using the above alloy composition.

Referring to FIG. 2, up to a diameter of the alloy rod of 6 mm, exothermic peaks according to crystallization behavior were observed during heating, but exothermic peaks were not observed for the alloy rod having a size of 8 mm. Thus, it may be understood that an amorphous phase, in addition to the nanocrystalline structure, was partially included in the alloy rod having a size of 6 mm. With respect to the alloy rods having a diameter of 2 mm, 5 mm, and 6 mm, it may be understood that glass transition temperatures (Tg) were 404.4° C., 400.9° C., and 391.3° C., respectively. It may be understood that crystallization initiation temperatures of the alloy rods were about 450° C.

Hardness and the presence of cracks according to an annealing temperature of the $Zr_{63.9}Al_{10}Cu_{26.1}$ alloy rod having a diameter of 2 mm and the $Zr_{63.9}Al_{10}Cu_{26.1}$ alloy rod having a size of 8 mm are presented in Table 1. Hardness measurements were performed at a load of 1 Kgf and the presence of cracks was determined by observing indentation marks at a load of 5 Kgf with an SEM analysis. Annealing was performed in a high-temperature vacuum furnace and annealing time was 30 minutes for all annealing temperatures.

TABLE 1

| Raw material | Manufacturing method | Measurement item | Hardness (Hv) and presence of cracks according to annealing temperature after hardness test of annealed rod | | | | |
|---|---|---|---|---|---|---|---|
| | | | 500° C. | 600° C. | 700° C. | 800° C. | 900° C. |
| Amorphous cast rod (φ 2 mm) | Copper mold suction casting method | Hardness (Hv) Presence of cracks | 705 ○ | 725 ○ | 710 X | 599 X | 473 ○ |
| Nanocrystalline cast rod (φ 8 mm) | Copper mold suction casting method | Hardness (Hv) Presence of cracks | 655 ○ | 725 ○ | 622 ○ | 606 X | 510 ○ |

Annealing: high-temperature vacuum furnace, holding for 30 minutes
Hardness measurement: hardness measurement at a load of 1 Kgf, observation of the presence of cracks at a load of 5 Kgf Referring to Table 1, with respect to both alloy rods having a diameter of 2 mm and 8 mm, hardness values were increased at an annealing temperature of 600° C. or less as the annealing temperature increased, but the hardness values tended to decrease above 600° C. Cracks did not occur in the alloy rod having a diameter of 2 mm at an annealing temperature of 700° C. and 800° C., and cracks did not occur in the alloy rod having a diameter of 8 mm at an annealing temperature of 800° C.

Figure 3:
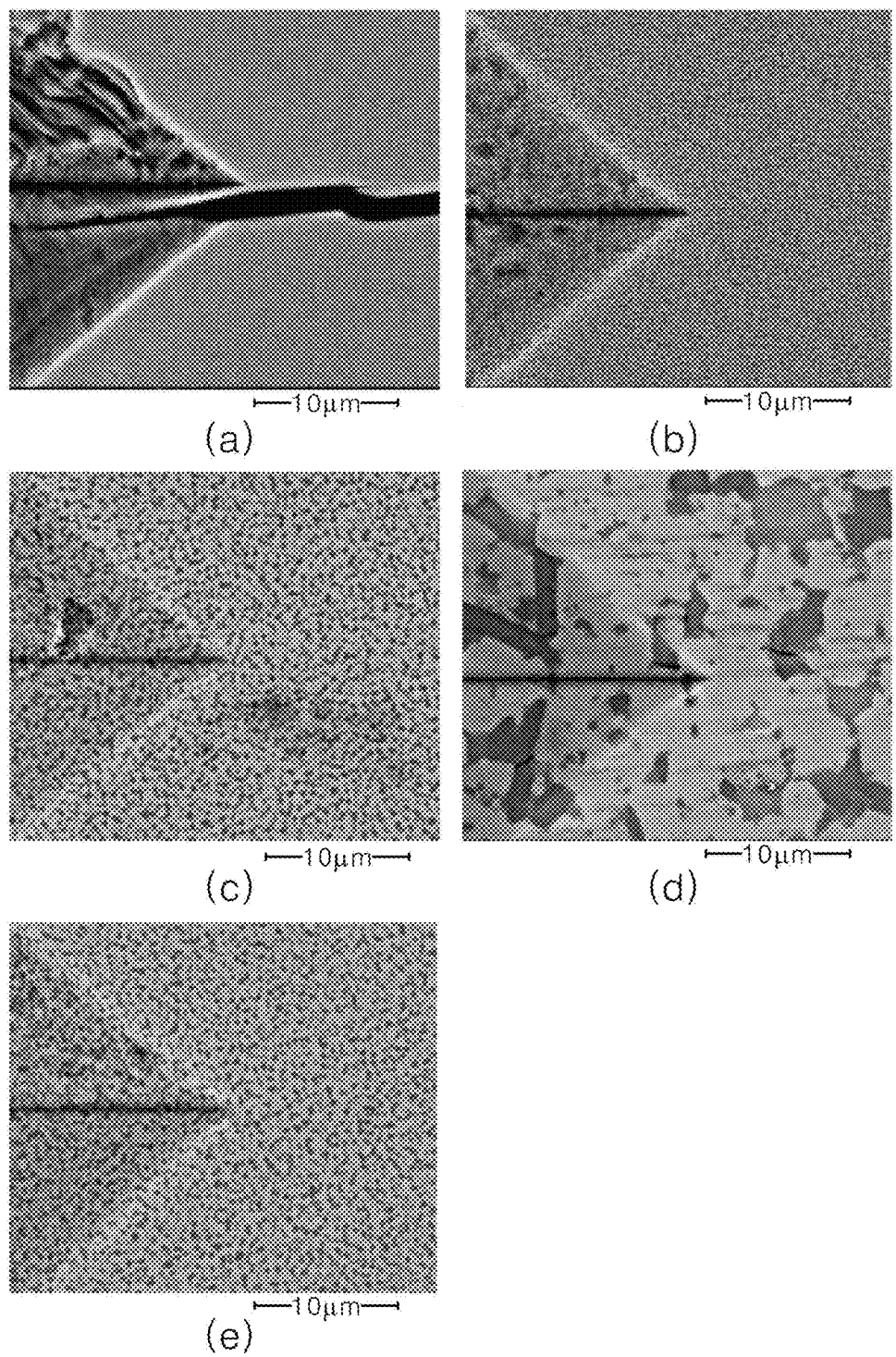
FIGS. 3a to 3e are the results of secondary electron microscope (SEM) observation around indentation marks after crack initiation tests of the $Zr_{63.9}Al_{10}Cu_{26.1}$ copper mold suction cast (rod) according to the embodiment of the present invention, according to annealing temperature.

FIGS. 3a to 3d respectively illustrate the results of observation around indentations when the alloy rods having a diameter of 2 mm were annealed at 600° C., 700° C., 800° C., and 900° C., and FIG. 3e illustrates the result of observation when the alloy rod having a diameter of 8 mm was annealed at 800° C.

Referring to FIGS. 3a to 3c, in a case where cracks occurred (see FIG. 3a), a nanocrystalline structure was observed in which an average grain size (hereinafter, referred to as "grain size" for convenience) was less than 0.1 µm. However, in a case where cracks were not observed (see FIGS. 3b and 3c), a crystalline structure was observed in which grains having a size of about 0.1 µm to about 1 µm were uniformly distributed. In a case where the grain size was greater than 5 µm (see FIG. 3d), cracks occurred. In a case where a microstructure similar to that of FIG. 3c was observed, it may be confirmed that cracks also did not occur in the alloy rod having a diameter of 8 mm as in FIG. 3e.

Thus, it may be understood that brittleness may be increased with an increase in hardness, in a case where an alloy rod in an amorphous state was annealed to be partially crystallized or crystallized in a microstructure having nanocrystalline grains. It may be considered that the increase in brittleness may be due to structural relaxation and changes in original free volume of the amorphous phase that is generated when the nanocrystalline grains were precipitated in an amorphous matrix.

However, when a grain size of the amorphous alloy was in a range of 0.1 µm to 5 µm, it may be understood that a phenomenon of increasing the brittleness due to the structural relaxation and the precipitation of the nanocrystalline grains did not occur even in the case in which the amorphous alloy was completely crystallized, and fracture toughness was significantly improved. Table 2 summarizes the results of amorphous characteristics and the presence of cracks, in a case where alloy casts (2 mm diameter rod, 0.5 mm thick plate) having various compositions in addition to the above-described alloy composition (Example 1 of Table 2) and including various amorphous phases or crystalline phases were annealed at 800° C. (with respect to Example 2 and Comparative Example 1, annealing was performed at 700° C.). Tg, Tx, and Tm of Table 2 respectively represent glass transition temperature, crystallization initiation temperature, and melting temperature (solidus temperature). The size of grains was measured by a grain diameter measurement method of metal in accordance with KS D0205.

TABLE 2

| Category | Chemical composition (at %) | Shape and thickness of cast | Amorphous characteristics | | | Grain size (µm) | | composition | | Ni + | Hardness measurement of annealed material | |
|---|---|---|---|---|---|---|---|---|---|---|---|---|
| | | | Tg | Tx | Tm | Ave | Max | Al | M | Cu | Hardness | Presence of cracks |
| Example 1 | Zr$_{63.9}$Al$_{10}$Cu$_{26.1}$ | φ 2 mm | 404 | 470 | 913 | 0.35 | 2.60 | 10.00 | 0.00 | 26.10 | 599 | X |
| Example 2 | Zr$_{63.9}$Al$_{10}$Cu$_{26.1}$ | φ 2 mm | 404 | 470 | 913 | 0.13 | 1.15 | 10.00 | 0.00 | 26.10 | 710 | X |
| Example 3 | Zr$_{69.6}$Al$_6$Cu$_{24.4}$ | φ 0.5 mm | 365 | 415 | 942 | 0.51 | 4.23 | 6.00 | 0.00 | 24.40 | 475 | X |
| Example 4 | Zr$_{70}$Al$_8$Ni$_{16}$Cu$_6$ | φ 2 mm | 375 | 466 | 878 | 0.58 | 2.86 | 8.00 | 0.00 | 22.00 | 562 | X |
| Example 5 | Zr$_{66.85}$Al$_9$Cu$_{24.15}$ | φ 2 mm | 383 | 457 | 902 | 0.46 | 2.54 | 9.00 | 0.00 | 24.15 | 502 | X |
| Example 6 | Zr$_{71.6}$Al$_{10}$Ni$_{1.85}$Cu$_{16.55}$ | φ 0.5 mm | 367 | 400 | 881 | 0.45 | 2.78 | 10.00 | 0.00 | 18.40 | 494 | X |
| Example 7 | Zr$_{66.2}$Al$_{10}$Cu$_{23.8}$ | φ 2 mm | 388 | 447 | 906 | 0.40 | 2.56 | 10.00 | 0.00 | 23.80 | 559 | X |
| Example 8 | Zr$_{59}$Al$_{10}$Cu$_{31}$ | φ 2 mm | 410 | 471 | 870 | 0.38 | 3.21 | 10.00 | 0.00 | 31.00 | 665 | X |
| Example 9 | Zr$_{49.8}$Al$_{10}$Cu$_{40.2}$ | φ 2 mm | 439 | 519 | 856 | 0.68 | 5.73 | 10.00 | 0.00 | 40.20 | 518 | X |
| Example 10 | Zr$_{55}$Al$_{10}$Ni$_{15}$Cu$_{30}$ | φ 2 mm | 425 | 488 | 842 | 0.58 | 3.69 | 10.00 | 0.00 | 35.00 | 610 | X |
| Example 11 | Zr$_{50.7}$Al$_{12.3}$Ni$_9$Cu$_{28}$ | φ 0.5 mm | 452 | 514 | 840 | 0.60 | 3.60 | 12.30 | 0.00 | 37.00 | 623 | X |
| Example 12 | Zr$_{52.6}$Al$_{16.4}$Cu$_{31}$ | φ 0.5 mm | 449 | 499 | 862 | 0.42 | 2.27 | 16.40 | 0.00 | 31.00 | 605 | X |
| Example 13 | Zr$_{52.2}$Al$_{20}$Cu$_{27.8}$ | φ 0.5 mm | 399 | 470 | 903 | 0.48 | 2.91 | 20.00 | 0.00 | 27.80 | 604 | X |
| Example 14 | Zr$_{64.6}$Al$_{7.1}$Cr$_{2.2}$Cu$_{26.1}$ | φ 2 mm | 384 | 452 | 893 | 0.49 | 4.99 | 7.10 | 2.50 | 26.10 | 564 | X |
| Example 15 | Zr$_{63}$Al$_8$Mo$_{1.5}$Cu$_{27.5}$ | φ 2 mm | 400 | 474 | 901 | 0.38 | 4.64 | 8.00 | 1.50 | 27.50 | 602 | X |
| Example 16 | Zr$_{70.5}$Al$_{10}$Si$_2$Cu$_{17.5}$ | φ 0.5 mm | 396 | 463 | 904 | 045 | 2.47 | 10.00 | 2.00 | 17.50 | 604 | X |
| Example 17 | Zr$_{55}$Al$_{10}$Ni$_{10}$Nb$_5$Cu$_{20}$ | φ 2 mm | 441 | 498 | 829 | 0.51 | 4.40 | 10.00 | 5.00 | 20.00 | 656 | X |
| Example 18 | Zr$_{67.3}$Al$_{10}$Si$_1$Cu$_{21.7}$ | φ 2 mm | 396 | 463 | 903 | 0.37 | 3.24 | 10.00 | 1.00 | 21.70 | 570 | X |
| Example 19 | Zr$_{62.5}$Al$_{10}$Mo$_5$Cu$_{22.5}$ | φ 2 mm | 409 | 480 | 879 | 0.39 | 1.52 | 10.00 | 5.00 | 22.50 | 651 | X |
| Example 20 | Zr$_{65.2}$Al$_{10}$Sn$_{1.2}$Cu$_{23.6}$ | φ 2 mm | 404 | 463 | 906 | 042 | 3.36 | 10.00 | 1.20 | 23.60 | 576 | X |
| Example 21 | Zr$_{64.7}$Al$_{10}$In$_1$Cu$_{24.3}$ | φ 2 mm | 396 | 467 | 902 | 0.50 | 5.10 | 10.00 | 1.00 | 24.30 | 606 | X |
| Example 22 | Zr$_{64.5}$Al$_{10}$Bi$_1$Cu$_{24.5}$ | φ 2 mm | 400 | 462 | 907 | 0.56 | 4.17 | 10.00 | 1.00 | 24.50 | 612 | X |

TABLE 2-continued

| Category | Chemical composition (at %) | Shape and thickness of cast | Amorphous characteristics Tg | Tx | Tm | Grain size (μm) Ave | Max | composition Al | M | Ni + Cu | Hardness measurement of annealed material Hardness | Presence of cracks |
|---|---|---|---|---|---|---|---|---|---|---|---|---|
| Example 23 | $Zr_{63.9}Al_{10}Zn_{1.4}Cu_{24.7}$ | φ 2 mm | 397 | 467 | 911 | 0.54 | 3.99 | 10.00 | 1.40 | 24.70 | 577 | X |
| Example 24 | $Zr_{63.8}Al_{10}V_{1.5}Cu_{24.7}$ | φ 2 mm | 399 | 455 | 889 | 042 | 2.73 | 10.00 | 1.50 | 24.70 | 584 | X |
| Example 25 | $Zr_{62.9}Al_{10}Hf_{1}Cu_{26.1}$ | φ 0.5 mm | 400 | 477 | 907 | 0.37 | 3.11 | 10.00 | 1.00 | 26.10 | 644 | X |
| Example 26 | $Zr_{61.6}Al_{12}Fe_{8}Cu_{18.4}$ | φ 2 mm | 410 | 477 | 869 | 043 | 2.44 | 10.00 | 8.00 | 18.40 | 607 | X |
| Example 27 | $Zr_{59.3}Al_{10}Ti_{5.7}Ni_{1.8}Cu_{23.2}$ | φ 0.5 mm | 396 | 477 | 833 | 0.53 | 5.49 | 10.00 | 5.70 | 25.00 | 571 | X |
| Example 28 | $Zr_{59.9}Al_{10}Ti_{5}Ni_{1.6}Cu_{23.5}$ | φ 0.5 mm | 397 | 475 | 856 | 0.58 | 4.50 | 10.00 | 5.00 | 25.10 | 587 | X |
| Example 29 | $Zr_{63.5}Al_{10}Ag_{2}Cu_{24.5}$ | φ 0.5 mm | 405 | 469 | 879 | 042 | 3.70 | 10.00 | 2.00 | 24.50 | 636 | X |
| Example 30 | $Zr_{68.9}Al_{6}Co_{3.5}Cu_{21.6}$ | φ 0.5 mm | 371 | 423 | 898 | 0.50 | 4.91 | 6.00 | 3.50 | 21.60 | 542 | X |
| Comparative Example 1 | $Zr_{50}Ni_{19}Ti_{16}Cu_{15}$ | φ 0.5 mm | 311 | 489 | 794 | 0.32 | 3.15 | 0.00 | 16.00 | 34.00 | 502 | ○ |
| Comparative Example 2 | $Zr_{50}Ni_{19}Ti_{16}Cu_{15}$ | φ 0.5 mm | 311 | 489 | 794 | 4.69 | 53.94 | 0.00 | 16.00 | 34.00 | 594 | ○ |
| Comparative Example 3 | $Zr_{55}Al_{20}Ni_{10}Ti_{5}Cu_{10}$ | φ 0.5 mm | 437 | 491 | 915 | 1.92 | 6.80 | 20.00 | 5.00 | 20.00 | 725 | ○ |
| Comparative Example 4 | $Zr_{55}Al_{19}Co_{19}Cu_{7}$ | φ 0.5 mm | 484 | 536 | 949 | 0.18 | 0.65 | 19.00 | 19.00 | 7.00 | 773 | ○ |

Figure 4:
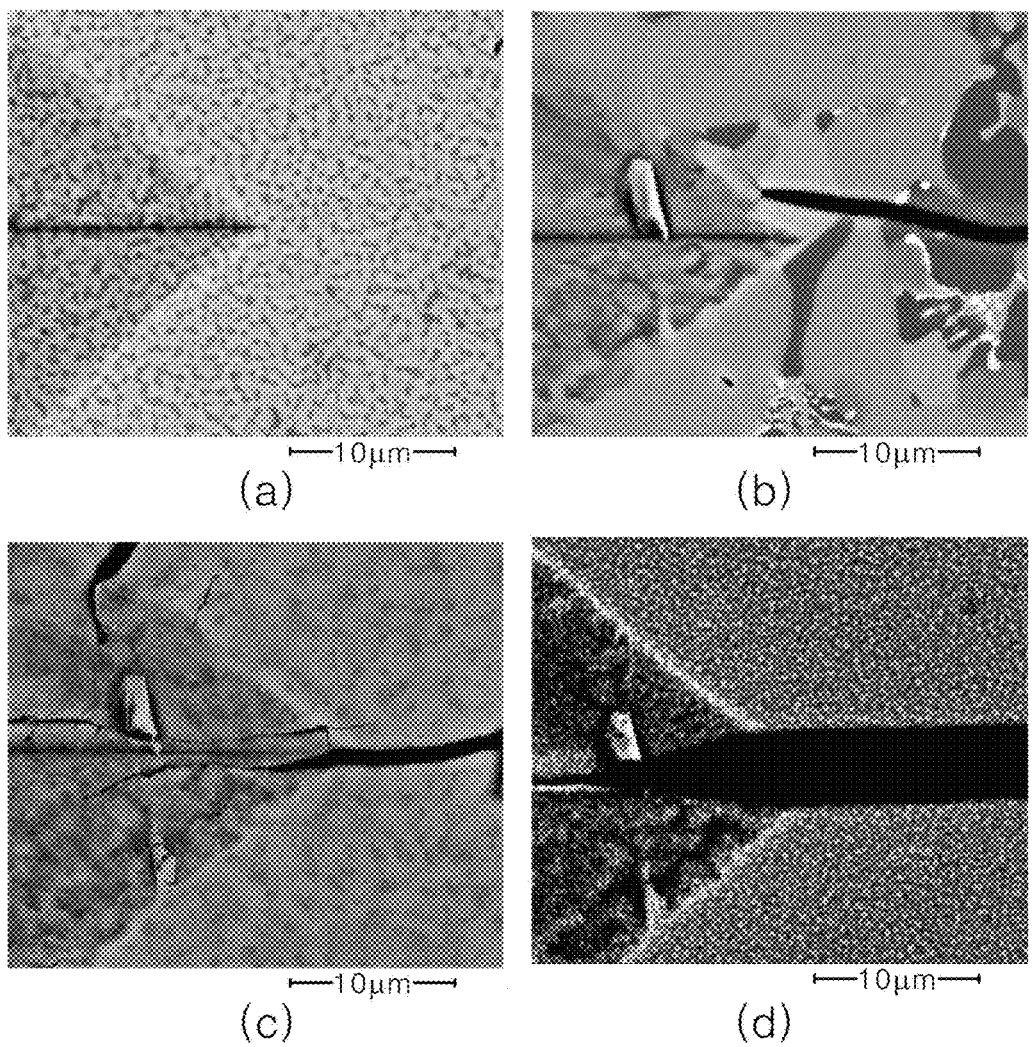
FIGS. 4a to 4d are the results of observation of microstructures of Example 3 and Comparative Examples 2 to 4, respectively.

Cast shape: amorphous or partially amorphous alloy cast by copper mold suction casting, 2 mm diameter alloy rod or 0.5 mm thick plate
Tg and Tx measurement: DSC (Perkin Elmer), heating rate: 20° C./min.
Tm: DTA (TA Instrument)
Grain size measurement: KS D0205, grain diameter measurement method of metal
Hardness measurement: Vickers hardness tester, hardness: 1 Kg load, presence of cracks: 5 Kg load Referring to Table 2, all alloys of Examples 2 to 30 after annealing also exhibited a microstructure which is very similar to that of the alloy of Example 1, and the occurrence of cracks was not observed during crack initiation tests. FIG. 4a exemplarily illustrates the result of observation of a microstructure of Example 3 after the crack initiation test by an indenter.

In contrast, cracks occurred in the sample (Comparative Example 1), in which Al was not included in the alloy, and the sample (Comparative Example 2) in which the annealing temperature was above its melting point. Also, with respect to the sample (Comparative Example 4) in which an amount of Cu was less than 15 at % and an amount of M (i.e., Co) was 8 at % or more, the occurrence of cracks was observed. In a case where other foreign metals in addition to Zr, Al, Cu, and Ni were further added, the occurrence of cracks was observed when an amount of Al was 20 at % or more (Comparative Example 3). FIGS. 4b to 4d illustrate the results of observation of microstructures of Comparative Examples 2 to 4 after the crack initiation tests, respectively.

Manufacture of Alloy Target Using a Plurality of Amorphous Alloy Rods

Table 3 illustrates the results of investigating hardness and the presence of cracks according to a bonding temperature of alloy targets, which were manufactured by preparing a plurality of amorphous alloy rods having a diameter of 3 mm and the alloy composition ($Zr_{63.9}Al_{10}Cu_{26.1}$) of Example 1, stacking the amorphous alloy rods in a graphite mold, and then bonding the amorphous alloy rods by heat-pressurizing in an electric pressure sintering apparatus. In this case, the bonding temperature denotes a contact temperature of the graphite mold. Also, ΔTx in Table 3 denotes a temperature selected from a temperature range between the glass transition temperature and the crystallization initiation temperature, i.e., a supercooled liquid temperature range.

TABLE 3

| Type of sintered material according to raw material | Manufacturing method | Measurement item | Hardness (Hv) and presence of cracks according to bonding temperature after hardness test of sintered material | | | | |
|---|---|---|---|---|---|---|---|
| | | | 410° C. (ΔTx) | 500° C. | 700° C. | 800° C. | 900° C. |
| Sintered body with amorphous cast body | Copper mold suction casting (φ 3 mm) + Stack bonding | Hardness (Hv) Presence of cracks | 652 ○ | 670 ○ | 691 X | 565 X | 498 ○ |

Figure 5:
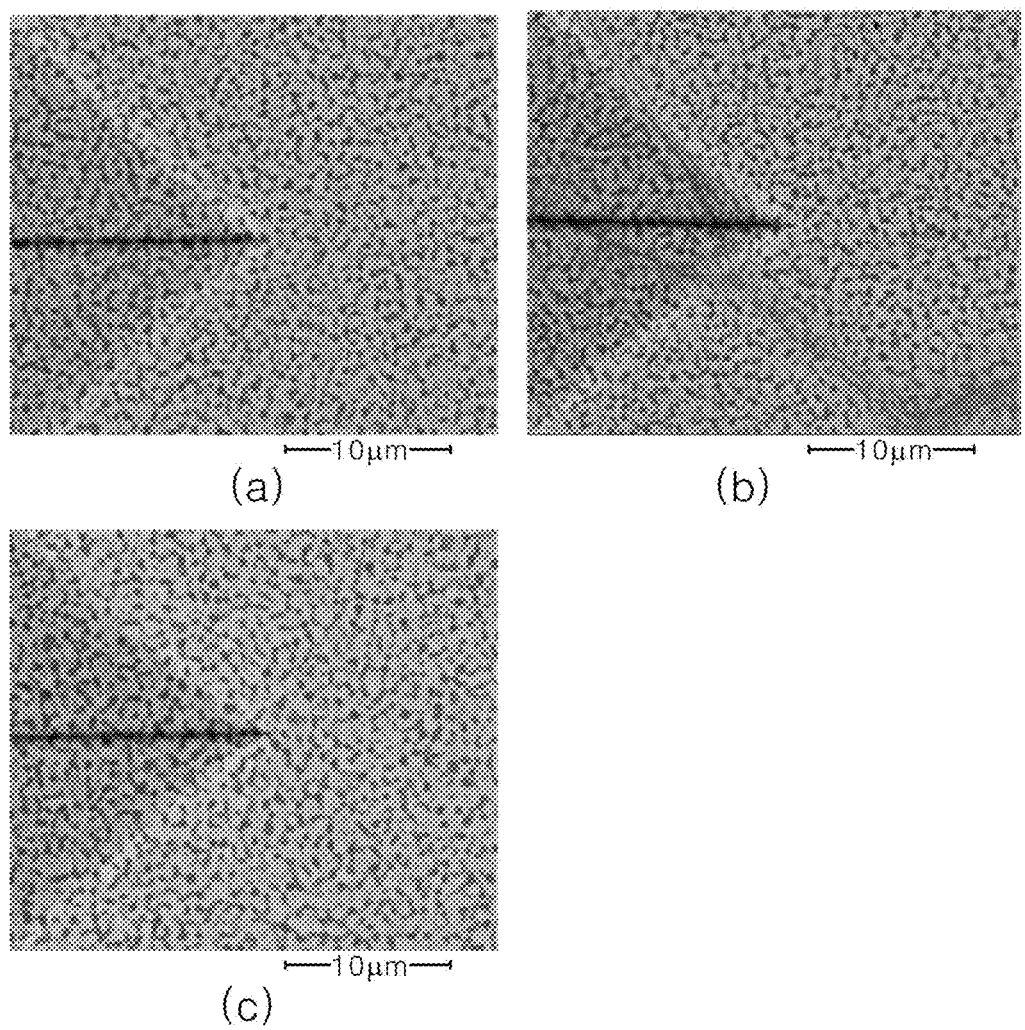
FIGS. 5a to 5c are the results of electron microscopic observation of microstructures of alloy targets which are respectively manufactured by using an amorphous alloy rod, amorphous alloy powder, nanocrystalline alloy powder, and an amorphous alloy ribbon.

Sintering condition: electric pressure sintering apparatus, holding time 30 minutes
Bonding temperature: graphite mold contact temperature Referring to Table 3, similar to the result illustrated in Table 1, cracks did not occur when the bonding temperature was 700° C. and 800° C. As the result of SEM observation, a crystalline structure was observed in which grains having a size of 1 μm or less were uniformly distributed. FIG. 5a exemplarily illustrates the result of electron microscopic observation of a microstructure of an alloy target manufactured by boning at 800° C.

Manufacture of Alloy Target Using Amorphous Alloy Powder or Nanocrystalline Alloy Powder Table 4 illustrates the results of investigating hardness and the presence of cracks according to a sintering temperature of alloy targets, which were manufactured by preparing an alloy having the same composition ($Zr_{63.9}Al_{10}Cu_{26.1}$) as Example 1 in a powder form, stacking the alloy in a graphite mold, and then pressure sintering in an electric pressure sintering apparatus.

Figure 6:
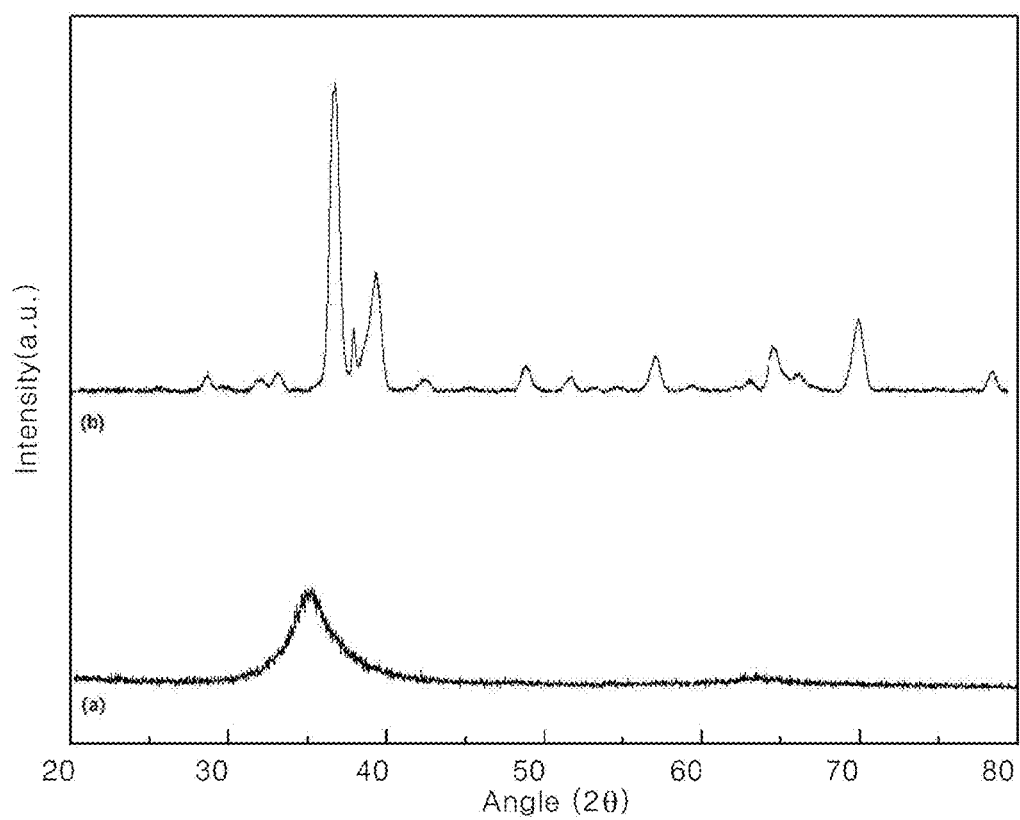
FIGS. 6a and 6b respectively illustrate X-ray diffraction patterns of amorphous powder prepared by a atomizing method and nanocrystalline powder obtained by annealing the amorphous powder at 600° C.

In this case, the alloy powder was prepared by an atomizing method, in which, specifically, alloy buttons were prepared by adjusting a compositional ratio of an alloy of Zr, Al, and Cu and melting the alloy by an arc melting method, the alloy buttons were high-frequency remelted using a powder preparation device, and the alloy powder was then prepared by atomizing the melted alloy with argon gas. The alloy powder thus prepared was amorphous, and the result of X-ray diffraction of the alloy powder is illustrated in FIG. 6a.

The amorphous alloy powder thus prepared was manufactured as an alloy target by directly sintering in a graphite mold, or the amorphous alloy powder thus prepared was prepared as nanocrystalline alloy powder by annealing at 600° C. in a high-vacuum furnace and the nanocrystalline alloy powder was then sintered to manufacture a target. FIG. 6b illustrates the result of X-ray diffraction of the amorphous alloy powder after the annealing.

Referring to the results of Table 4, with respect to the alloy target manufactured by the amorphous alloy powder, cracks did not occur at 700° C. and 800° C., and cracks did not occur at 800° C. with respect to the alloy target manufactured by the nanocrystalline alloy powder. As the result of SEM observation, all alloy targets, in which cracks did not occur, exhibited a crystalline structure in which grains having a size of 1 μm or less were uniformly distributed. FIGS. 5b and 5C respectively illustrate the results of SEM observation of microstructures of the alloy targets which were manufactured by the amorphous alloy powder and the nanocrystalline alloy powder at 800° C.

Manufacture of Alloy Target Using Amorphous Alloy Ribbon

Table 5 illustrates the results of investigating hardness and the presence of cracks according to a pressurizing temperature of alloy targets, which were manufactured by preparing an amorphous alloy having the same composition ($Zr_{63.9}Al_{10}Cu_{26.1}$) as Example 1 in the form of a ribbon, stacking the plurality of ribbons in a graphite mold, and then pressure sintering (bonding) in an electric pressure sintering apparatus.

TABLE 5

| Type of sintered material according to raw material | Manufacturing method | Measurement item | Hardness (Hv) and presence of cracks according to sintering temperature after hardness test of sintered material | | | | |
|---|---|---|---|---|---|---|---|
| | | | 420° C. | 500° C. | 700° C. | 800° C. | 900° C. |
| Melt spinning ribbon | Amorphous ribbon + sintering | Hardness (Hv) Presence of cracks | 631 ○ | 663 ○ | 678 ○ | 575 X | 522 ○ |

Sintering condition: electric pressure sintering apparatus, holding time 30 minutes
Sintering temperature: graphite mold contact temperature In this case, the amorphous alloy ribbons were prepared by a melt spinning method, in which, specifically, an alloy melt was prepared by adjusting a compositional ratio of an alloy of Zr, Al, and Cu and melting the alloy by an arc melting method, and the amorphous alloy ribbons were then prepared by rapid solidifying the alloy melt by injecting the alloy melt on the surface of a copper roll having a diameter of 600 mm and rotating at a high speed of 700 rpm through a nozzle. In this case, the thickness of the amorphous alloy ribbon was 70 μm.

Referring to Table 5, cracks did not occur when the sintering temperature was 800° C. According to the result of SEM observation in FIG. 5d, the alloy target exhibited a

TABLE 4

| Type of sintered material according to raw material | Manufacturing method | Measurement item | Hardness (Hv) and presence of cracks according to sintering temperature after hardness test of sintered material | | | | |
|---|---|---|---|---|---|---|---|
| | | | 420° C. | 500° C. | 700° C. | 800° C. | 900° C. |
| Sintered body with amorphous powder | Gas atomizing + sintering | Hardness (Hv) Presence of cracks | 582 ○ | 678 ○ | 656 X | 591 X | 523 ○ |
| Sintered boy with nanocrystalline powder | Gas atomizing + 600° C. annealing + sintering | Hardness (Hv) Presence of cracks | — — | — — | 578 ○ | 578 X | 504 ○ |

Sintering condition: electric pressure sintering apparatus, holding time 30 minutes
Sintering temperature: graphite mold contact temperature
Annealing: high-vacuum furnace, holding for 30 minutes crystalline structure in which grains having a size of 1 μm or less were uniformly distributed, as in the result of the above-described example.

Figure 7:
FIG. 7 is the result of observation of the surface of a target after sputtering of a crystalline alloy target ($Zr_{62.5}Al_{10}Mo_5Cu_{22.5}$) manufactured according to an embodiment of the present invention.

Sputtering Characteristics of Crystalline Alloy Target, Amorphous Alloy Target, and Cast Alloy Target FIG. 7 illustrates the result of observation of the surface of an alloy target when the crystalline alloy target ($Zr_{62.5}Al_{10}Mo_5Cu_{22.5}$) manufactured by sintering amorphous alloy powder at 800° C. was installed in an actual sputter and 300 W direct current (DC) plasma power was applied thereto. Also, a microstructure of the alloy target before sputtering is illustrated in FIG. 8a, and the result of observation of the surface of the sputtered target after the sputtering is illustrated in FIG. 8b.

Figure 8:
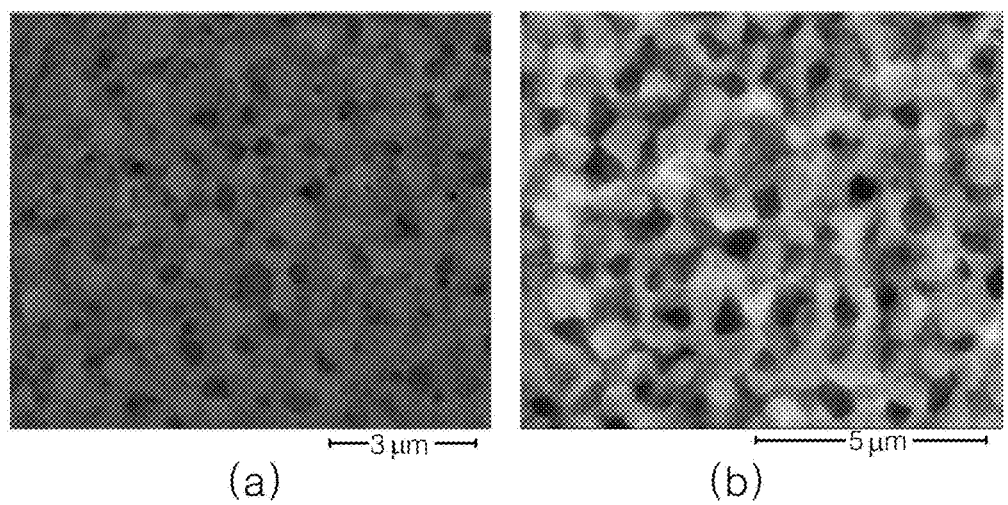
FIGS. 8a and 8b are the results of observation of the microstructure of the crystalline alloy target ($Zr_{62.5}Al_{10}Mo_5Cu_{22.5}$) of FIG. 7 before the sputtering and the surface of the sputtered target after the sputtering, respectively.

Referring to FIGS. 7, 8a, and 8b, with respect to the crystalline alloy target, it may be understood that the target had a very smooth surface even after the sputtering and a structure of the alloy was not significantly changed before and after the sputtering. Thus, it may be understood that the crystalline alloy target according to an embodiment of the present invention exhibited excellent thermal/mechanical stability in which the structure of the alloy was not changed even due to the temperature rise occurred during the sputtering.

Figure 9:
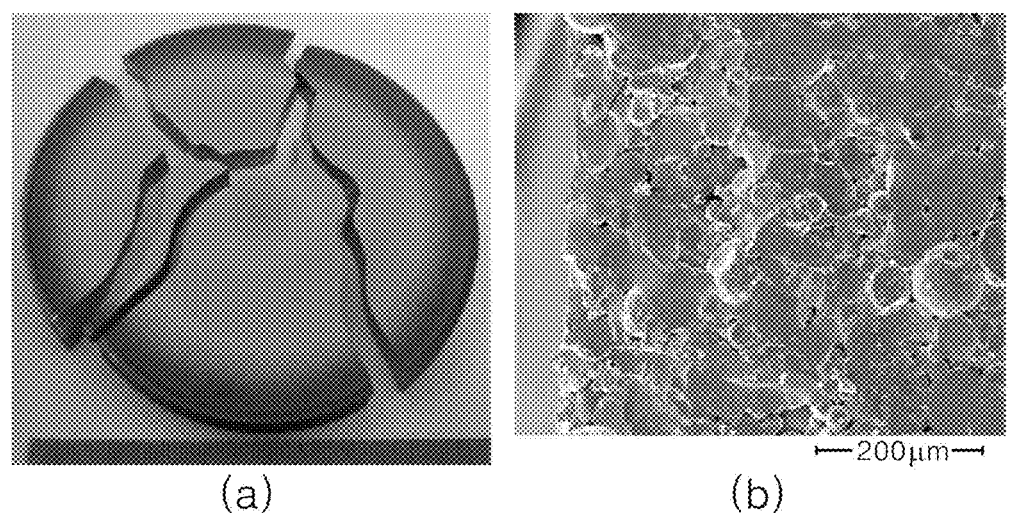
FIGS. 9a and 9b are the result of observation of fracture of an amorphous alloy target having the same composition as the crystalline alloy target of FIG. 7 occurred during sputtering of the target, and the result of SEM observation of the fracture surface thereof, respectively.

FIG. 9a, as a comparative example, illustrates the result of observation of the fracture of a target occurred when sputtering was performed under the same condition by using an amorphous alloy target manufactured by sintering amorphous alloy powder having the same composition ($Zr_{62.5}Al_{10}Mo_5Cu_{22.5}$) in a supercooled liquid temperature range, and FIG. 9b illustrates the result of SEM observation of a fracture surface of the amorphous alloy target.

Referring to FIGS. 9a and 9b, it may be confirmed that fracture may occur in the amorphous alloy target during a sputtering process, and when observing the characteristics of the fracture surface, it may be understood that the characteristics of brittle fracture having a flat surface were observed. Thus, it may be understood that the fracture did not occur along a fracture path of an interface between grains but occurred along a fracture path penetrating the inside of the grains.

Figure 10:
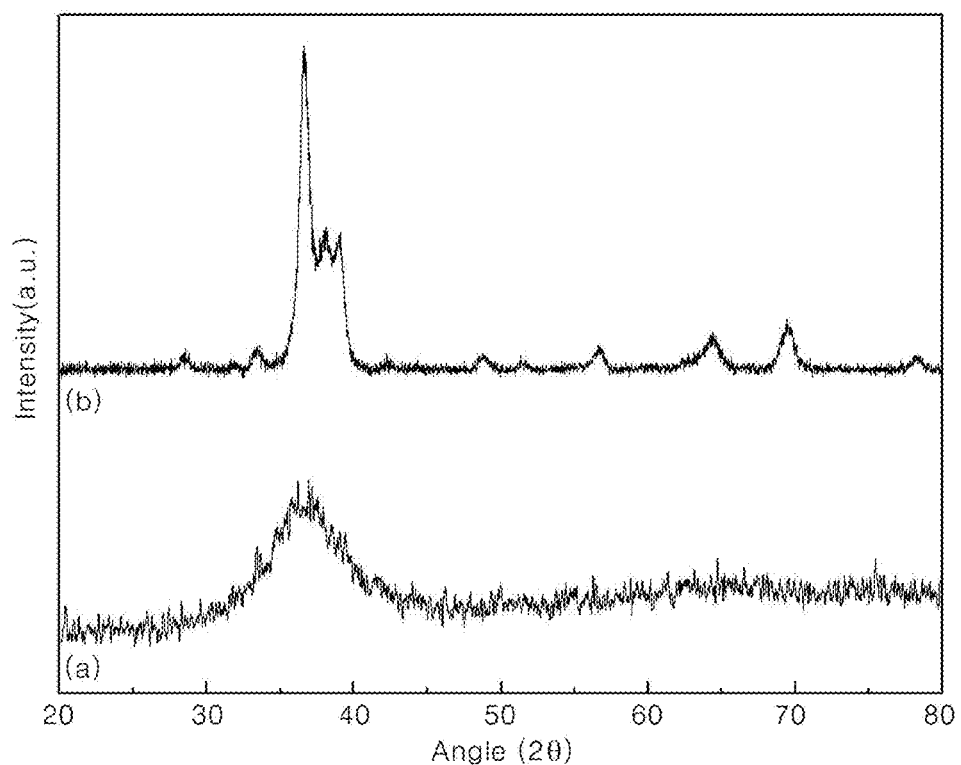
FIGS. 10a and 10b respectively illustrate X-ray diffraction patterns of the amorphous alloy target of FIG. 9 before and after the sputtering process.

FIGS. 10a and 10b respectively illustrate X-ray diffraction patterns of the amorphous alloy target before and after the sputtering, and according to the result of X-ray diffraction, it may be understood that an amorphous phase before the sputtering was partially crystallized during the sputtering process.

Figure 11:
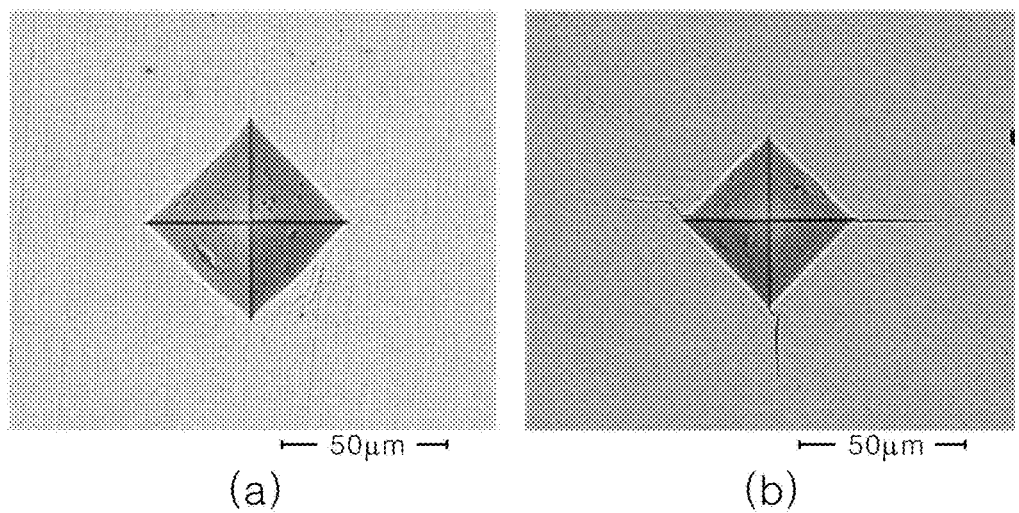
FIGS. 11a and 11b are the results of SEM observation around indentation marks after crack initiation tests of the amorphous alloy target of FIG. 9 before and after the sputtering, respectively.

FIGS. 11a and 11b illustrate SEM images around indentations after crack initiation tests (vertical load: 1 kgf) of the alloy target before and after the sputtering, respectively. With respect to the amorphous alloy target, brittleness was increased according to the precipitation of nanograins during the sputtering process, and thus, as illustrated in FIG. 11b, cracks occurred during the crack initiation test.

Thus, with respect to the amorphous alloy target, since thermal stability was poor, localized crystallization may occur due to the temperature rise occurred during the sputtering. It may be confirmed that since the brittleness may be increased due to the localized crystallization, the target may be fractured during the sputtering process.

Figure 12:
FIG. 12 is the result of observation of the surface of a cast alloy target having the same composition as the crystalline alloy target of FIG. 7 after sputtering.

FIG. 12, as another example, illustrates the result of observation of the surface of an alloy target when the alloy target with the same composition ($Zr_{62.5}Al_{10}Mo_5Cu_{22.5}$) manufactured by a general casting method was installed in an actual sputter and 300 W DC plasma power was applied thereto. Also, a microstructure of the alloy target before sputtering is illustrated in FIG. 13a, and the result of observation of the surface of the sputtered target after the sputtering is illustrated in FIG. 13b.

Figure 13:
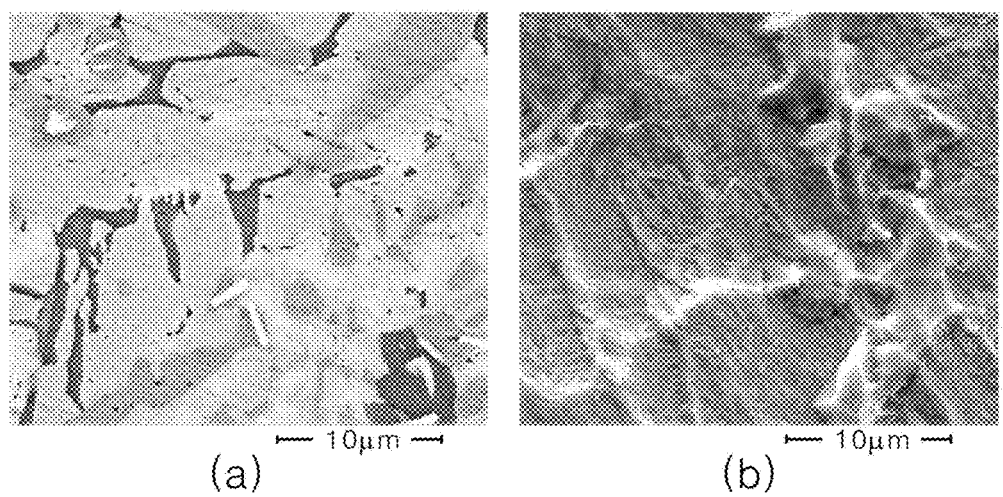
FIGS. 13a and 13b are the results of observation of a microstructure of the cast alloy target of FIG. 12 before sputtering and the surface of the sputtered target after the sputtering, respectively.

Referring to FIGS. 12, 13a, and 13b, with respect to the cast alloy target, it may be understood that a surface, on which the sputtering occurred, was non-uniform and relatively rough in comparison to that of the crystalline alloy target (see FIG. 7) of the present invention. It may be considered that since the microstructure of the cast alloy target was coarse and non-uniform, the sputtering on the surface thereof occurred non-uniformly.

As illustrate in FIG. 13a, the cast alloy target exhibited a non-uniform microstructure in which coarse phases with various sizes and shapes having different compositions, such as a columnar structure or a primary crystal in the form of a dendrite, were mixed. The sputtered surface may be non-uniformly formed, as in FIG. 13b, due to the non-uniformity of the microstructure.

Uniformity of a thin film composition prepared by sputtering may be poor due to the non-uniformity of the cast alloy target. Also, a significant difference between a composition of the target and a composition of a thin film formed by the sputtering may occur, and characteristic of the thin film may be adversely affected, for example, the composition of the thin film may be changed as the sputtering proceeded. Furthermore, since particles may be generated from the target during the sputtering, a sputtering chamber may be contaminated.

Figure 14:
FIG. 14 is the result of observation of a cast alloy target fractured during a solidification process.

Also, in a case of casting a multi-component alloy, since various intermetallic compounds having high brittleness may be formed, a phenomenon may occur in which brittle fracture of a target occurs during the casting or in a process of processing the target after the casting. For example, FIG. 14 illustrates the result of observation of a 3 inch cast alloy target having a composition of $Zr_{63.9}Al_{10}Cu_{26.1}$ which was fractured due to the occurrence of cracks during natural solidification after being arc melted in a water-cooled copper hearth.

In contrast, since the crystalline alloy target according to the present invention had a microstructure in which fine grains were uniformly distributed, very uniform sputtering may occur on the surface of the target. Thus, a composition of the formed thin film was uniform and the composition of the thin film that is similar to the composition of the target may be obtained. Also, different from the cast alloy target, the generation of particles may be significantly improved.

Table 6 illustrates compositions of thin films that were respectively prepared by sputtering crystalline alloy target and cast alloy target having a composition of $Zr_{62.5}Al_{10}Mo_5Cu_{22.5}$. In this case, DC 200 W power was applied to each sputtering target, and a chamber pressure was 5 mTorr. A thickness of the deposited films was 10 μm, and the compositions were analyzed by an electron probe microanalyzer (EPMA).

Referring to Table 6, it may be understood that the composition of the thin film formed using the crystalline target was more similar to the composition of the target in comparison to the case in which the thin film is formed using the cast target.

TABLE 6

| Target type | Chemical composition (at %) | | | |
|---|---|---|---|---|
| | Zr | Al | Mo | Cu |
| Crystalline target | 62.45 | 10.83 | 6.10 | 20.60 |
| Cast alloy target | 63.23 | 11.29 | 7.19 | 18.29 |

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method of manufacturing an alloy sputtering target, the method comprising:
preparing an amorphous alloy or a nanocrystalline alloy having glass-forming ability and comprising three or more metallic elements; and
heat-pressurizing the amorphous alloy or the nanocrystalline alloy in a temperature range of a crystallization initiation temperature of the amorphous alloy or the nanocrystalline alloy or higher but lower than a melting temperature thereof to manufacture a crystalline alloy having an average grain size of 0.1 μm to 5 μm,
wherein the amorphous alloy or the nanocrystalline alloy comprises 5 at % to 20 at % of aluminum (Al), 15 at % to 35 at % of any one or more elements selected from copper (Cu) and nickel (Ni), and the remainder being zirconium (Zr).

2. A method of manufacturing an alloy sputtering target, the method comprising:
preparing an amorphous alloy or a nanocrystalline alloy having glass-forming ability and comprising three or more metallic elements; and
heat-pressurizing the amorphous alloy or the nanocrystalline alloy in a temperature range of a crystallization initiation temperature of the amorphous alloy or the nanocrystalline alloy or higher but lower than a melting temperature thereof to manufacture a crystalline alloy having an average grain size of 0.1 μm to 5 μm,
wherein the amorphous alloy or the nanocrystalline alloy comprises 5 at % to 15 at % of Al, 15 at % to 30 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being Zr.

3. The method of any one of claims 1 or 2, wherein the average grain size is in a range of 0.1 μm to 0.5 μm.

4. The method of any one of claims 1 or 2, wherein the amorphous alloy or the nanocrystalline alloy is amorphous alloy powder or nanocrystalline alloy powder.

5. The method of claim 4, wherein the amorphous alloy powder or the nanocrystalline alloy powder is prepared by an atomizing method,
wherein the atomizing method comprises:
preparing a melt in which the three or more metallic elements are melted; and
spraying gas on the melt.

6. The method of any one of claims 1 or 2, wherein the amorphous alloy or the nanocrystalline alloy is an amorphous alloy ribbon or a nanocrystalline alloy ribbon.

7. The method of claim 6, wherein the amorphous alloy ribbon or the nanocrystalline alloy ribbon is prepared by a melt spinning method,
wherein the melt spinning method comprises:
preparing a melt in which the three or more metallic elements are melted; and
introducing the melt to a rotating roll.

8. The method of any one of claims 1 or 2, wherein the amorphous alloy or the nanocrystalline alloy is an amorphous alloy cast or a nanocrystalline alloy cast.

9. The method of claim 8, wherein the amorphous alloy cast or the nanocrystalline alloy cast is prepared by a copper mold casting method,
wherein the copper mold casting method comprises:
preparing a melt in which the three or more metallic elements are melted; and
injecting the melt into a copper mold using a pressure difference between the inside and the outside of the copper mold.

10. The method of claim 8, wherein the amorphous alloy cast or the nanocrystalline alloy cast has a rod shape or plate shape.

11. A method of manufacturing an alloy sputtering target, the method comprising:
heating an amorphous alloy or a nanocrystalline alloy in a temperature range of a crystallization initiation temperature of the amorphous alloy or the nanocrystalline alloy or higher but lower than a melting temperature thereof to manufacture a crystalline alloy having an average grain size of 0.1 μm to 5 μm,
wherein the amorphous alloy or the nanocrystalline alloy is prepared by casting a melt comprising three or more metallic elements and having glass-forming ability, and comprises 5 at % to 20 at % of aluminum (Al), 15 at % to 35 at % of any one or more elements selected from copper (Cu) and nickel (Ni), and the remainder being zirconium (Zr).

12. A method of manufacturing an alloy sputtering target, the method comprising:
heating an amorphous alloy or a nanocrystalline alloy in a temperature range of a crystallization initiation temperature of the amorphous alloy or the nanocrystalline alloy or higher but lower than a melting temperature thereof to manufacture a crystalline alloy having an average grain size of 0.1 μm to 5 μm,
wherein the amorphous alloy or the nanocrystalline alloy is prepared by casting a melt comprising three or more metallic elements and having glass-forming ability, and comprises 5 at % to 15 at % of Al, 15 at % to 30 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being zirconium (Zr).

13. A method of manufacturing an alloy sputtering target, the method comprising:
atomizing a melted alloy by spraying argon gas onto the melted alloy to prepare an amorphous alloy powder;
annealing the amorphous alloy powder in a high-vacuum furnace; and
sintering and heating the amorphous alloy powder in a temperature range of a crystallization initiation temperature of the amorphous alloy powder or higher but lower than a melting temperature thereof to manufacture a crystalline alloy having an average grain size of 0.1 μm to 5 μm, wherein the alloy powder comprises 5 at % to 20 at % of aluminum (Al), 15 at % to 35 at % of any one or more elements selected from copper (Cu) and nickel (Ni), and the remainder being zirconium (Zr).

14. The method of claim 13, further comprising:
adjusting an elemental compositional ratio of alloy buttons with three or more metallic elements; and
melting the alloy buttons to form the melted alloy.

15. The method of any one of claims 1, 2, 11, 12, 13, or 14 further comprising annealing the crystalline alloy in a vacuum furnace.

16. A method of manufacturing an alloy sputtering target, the method comprising:
   atomizing a melted alloy by spraying argon gas onto the melted alloy to prepare an amorphous alloy powder;
   annealing the amorphous alloy powder in a high-vacuum furnace; and
   sintering and heating the amorphous alloy powder in a temperature range of a crystallization initiation temperature of the amorphous alloy powder or higher but lower than a melting temperature thereof to manufacture a crystalline alloy having an average grain size of 0.1 µm to 5 µm, wherein the alloy powder comprises 5 at % to 15 at % of Al, 15 at % to 30 at % of any one or more elements of Cu and Ni, 8 at % or less (greater than 0) of any one or more elements selected from the group consisting of chromium (Cr), molybdenum (Mo), silicon (Si), niobium (Nb), cobalt (Co), tin (Sn), indium (In), bismuth (Bi), zinc (Zn), vanadium (V), hafnium (Hf), silver (Ag), titanium (Ti), and iron (Fe), and the remainder being zirconium (Zr).

17. The method of claim 16, further comprising:
   adjusting an elemental compositional ratio of alloy buttons with three or more metallic elements; and
   melting the alloy buttons to form the melted alloy.

* * * * *